United States Patent
Tsuchimoto et al.

(10) Patent No.: US 11,005,402 B2
(45) Date of Patent: May 11, 2021

(54) CONTROL DEVICE FOR MOTOR, AND ELECTRIC POWER STEERING SYSTEM

(71) Applicant: Mitsubishi Electric Corporation, Tokyo (JP)

(72) Inventors: Yuya Tsuchimoto, Tokyo (JP); Isao Kezobo, Tokyo (JP); Shunsuke Nakajima, Tokyo (JP); Akira Furukawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/603,867

(22) PCT Filed: May 2, 2017

(86) PCT No.: PCT/JP2017/017278
§ 371 (c)(1),
(2) Date: Oct. 9, 2019

(87) PCT Pub. No.: WO2018/203393
PCT Pub. Date: Nov. 8, 2018

(65) Prior Publication Data
US 2020/0119674 A1    Apr. 16, 2020

(51) Int. Cl.
*H02P 29/60*    (2016.01)
*H02P 21/13*    (2006.01)
(Continued)

(52) U.S. Cl.
CPC .......... *H02P 21/13* (2013.01); *B62D 5/0409* (2013.01); *B62D 5/0463* (2013.01); *H02P 21/22* (2016.02); *H02P 27/12* (2013.01)

(58) Field of Classification Search
CPC .......... H02P 21/13; H02P 21/22; H02P 27/12; H02P 6/28; H02P 29/024; B62D 5/0409; B62D 5/0463; B62D 5/049
See application file for complete search history.

(56) References Cited

U.S. PATENT DOCUMENTS

2006/0001392 A1*  1/2006  Ajima ................. B62D 5/0463
                                                    318/432
2006/0001394 A1*  1/2006  Yukumatsu ............ B62D 5/046
                                                    318/632
(Continued)

FOREIGN PATENT DOCUMENTS

JP        2003-237597 A    8/2003
JP         4672236 B2       4/2011
(Continued)

OTHER PUBLICATIONS

International Search Report of PCT/JP2017/017278 dated Jul. 25, 2017.

*Primary Examiner* — Muhammad S Islam
(74) *Attorney, Agent, or Firm* — Sughrue Mion, PLLC; Richard C. Turner

(57) ABSTRACT

A control device for a motor, comprising: a power converter for performing ON/OFF control on an upper switching element and a lower switching element in accordance with a drive command from a current controller, and thereby supplying power to a motor; a current sensor provided to the lower switching element; and a fault determining unit for determining a fault in the current sensor. When the lower switching element for each phase is OFF, the current sensor detects the current error in each phase. The fault determining unit obtains a current error determination value on the basis of the value obtained by converting, to Cartesian coordinates, the current error for each phase or the magnitude of the sum of current error vectors for each phase in which the value for the current error for each phase is held as the magnitude, and determines a fault.

8 Claims, 7 Drawing Sheets

(51) Int. Cl.
*H02P 21/22* (2016.01)
*B62D 5/04* (2006.01)
*H02P 27/12* (2006.01)

(56) References Cited

U.S. PATENT DOCUMENTS

| | | | |
|---|---|---|---|
| 2007/0002505 A1* | 1/2007 | Watanabe | H02M 7/53873 361/23 |
| 2012/0211299 A1* | 8/2012 | Yanai | B62D 5/046 180/446 |
| 2018/0244308 A1* | 8/2018 | Furukawa | H02P 21/22 |
| 2019/0140566 A1* | 5/2019 | Pramod | G01R 19/0092 |

FOREIGN PATENT DOCUMENTS

| | | |
|---|---|---|
| JP | 5023833 B2 | 9/2012 |
| WO | 02/091558 A1 | 11/2002 |

\* cited by examiner

CONTROL DEVICE FOR MOTOR, AND ELECTRIC POWER STEERING SYSTEM

CROSS REFERENCE TO RELATED APPLICATIONS

This application is a National Stage of International Application No. PCT/JP2017/017278 filed May 2, 2017.

TECHNICAL FIELD

The present invention relates to a control device for a motor and an electric power steering system, and more particularly, to a control device for a motor, which is capable of detecting a failure in a current detection system of a power converter configured to drive the motor, and an electric power steering system including the control device for a motor.

BACKGROUND ART

Hitherto, a failure determination unit configured to detect a failure that makes control of a motor difficult, such as a failure in a drive circuit and a failure in a current detection unit, has been provided for a control device for a motor. Moreover, when the failure determination unit detects an occurrence of a failure, an abnormal behavior of the motor is prevented by quickly stopping the control of the motor. For example, there is a method described in Patent Literature 1 as a determination method for a failure in a current sensor.

In Patent Literature 1, the current sensor configured to detect a current in each phase is connected in series to a switching element on a low electric potential side (lower side) in each phase, and detects a value of a current in each phase at a timing at which the switching element on the low electric potential side (lower side) is turned off. The current value in each phase is supposed to be basically zero at the timing at which the switching element on the low electric potential side (lower side) is turned off. Thus, when the current is not zero, an error from an actual current in each phase is contained in the detected current in each phase. The value of the current in each phase acquired at the timing at which the switching element on the low electric potential side (lower side) is turned off indicates the error contained in the current in each phase.

The error contained in the detected current in each phase includes, for example, an offset error caused by a temperature change and a noise component caused by the switching. The error in the current in each phase acquired at the timing at which the switching element on the low electric potential side (lower side) is turned off is hereinafter referred to simply as "current error in each phase".

When an excessive current error exists, an abnormal behavior, for example, an occurrence of an excessive torque ripple, is presented. The method described in Patent Literature 1 determines that a failure exists when an acquired current error in each phase is equal to or larger than a threshold value set in advance. When a failure occurs, it is required to quickly detect the failure and stop the control of the motor to prevent an abnormal behavior.

Meanwhile, there is also a need for continuing the control of the motor as long as possible, which is not described in Patent Literature 1. For example, in an electric power steering system mounted on a vehicle, there is a need for continuing assist by a motor until a driver parks the vehicle on a roadside after a failure occurs. In such a case, a control method may be changed so as to estimate a current in a phase in failure based on values of currents in phases other than the phase in failure. However, when there is a method of continuing the control without changing the control method, harmful influence is not caused by the change in the control method, and such a method is thus preferred.

CITATION LIST

Patent Literature

[PTL 1] JP 5023833 B2
[PTL 2] JP 2003-237597 A
[PTL 3] JP 4672236 B2

SUMMARY OF INVENTION

Technical Problem

The current control of a motor is generally executed by converting the detected currents in respective phases to currents on the d axis and the q axis, which are rotating Cartesian coordinates. However, the detected current in each phase detected by the current sensor contains an error. First, a description is given of influence of the current error in each phase contained in the detected current in each phase detected by the current sensor.

Problems described below apply to a motor including windings in three phases or more, but the description is given of a case of three phases (a U phase, a V phase, and a W phase) for the sake of simple description.

When actual currents iur, ivr, and iwr in the respective phases are converted to currents on the d axis and q axis, actual d-axis current idr and q-axis current iqr are given by Expression (1), where θ represents a rotation angle of the motor. In the expression, Cdq represents a conversion matrix for converting the detected currents in the respective phases to the currents on the d axis and the q axis, which are the rotating Cartesian coordinates.

$$\begin{bmatrix} i_{dr} \\ i_{qr} \end{bmatrix} = \sqrt{\frac{2}{3}} \begin{bmatrix} \cos\theta & \cos\left(\theta - \frac{2}{3}\pi\right) & \cos\left(\theta + \frac{2}{3}\pi\right) \\ -\sin\theta & -\sin\left(\theta - \frac{2}{3}\pi\right) & -\sin\left(\theta + \frac{2}{3}\pi\right) \end{bmatrix} \begin{bmatrix} i_{ur} \\ i_{ur} \\ i_{ur} \end{bmatrix} = C_{dq} \begin{bmatrix} i_{ur} \\ i_{ur} \\ i_{ur} \end{bmatrix} \quad (1)$$

$$C_{dq} = \sqrt{\frac{2}{3}} \begin{bmatrix} \cos\theta & \cos\left(\theta - \frac{2}{3}\pi\right) & \cos\left(\theta + \frac{2}{3}\pi\right) \\ -\sin\theta & -\sin\left(\theta - \frac{2}{3}\pi\right) & -\sin\left(\theta + \frac{2}{3}\pi\right) \end{bmatrix} \quad (2)$$

Meanwhile, when the current errors exist, the current errors Δiu, Δiv, and Δiw in the respective phases are added to the actual currents iur, ivr, and iwr in the respective phases, respectively, and the detected currents iu, iv, and iw in the respective phases are thus given by Expression (3). Moreover, when the current errors exist, the d-axis detected current id and the q-axis detected current iq are given by Expression (4). A d-axis current error Δid and a q-axis current error Δiq in Expression (4) are given by Expression (5). In Expression (5), √(⅔)×Δlamp represents an amplitude given by Expression (6), and φ represents a phase satisfying Expression (7).

In particular, the current on the q axis indicates a value proportional to a torque generated in the motor, and it is thus found that a torque ripple changing in accordance with the rotation angle θ occurs. Therefore, for example, when an excessive torque ripple occurs due to the current error, it is required to determine that the current sensor has a failure, and to stop the control of the motor, or to change the control method for the motor.

$$\begin{bmatrix} i_u \\ i_v \\ i_w \end{bmatrix} = \begin{bmatrix} i_{ur} \\ i_{vr} \\ i_{wr} \end{bmatrix} + \begin{bmatrix} \Delta i_u \\ \Delta i_v \\ \Delta i_w \end{bmatrix} \quad (3)$$

$$\begin{bmatrix} i_d \\ i_q \end{bmatrix} = C_{dq} \begin{bmatrix} i_u \\ i_v \\ i_w \end{bmatrix} = C_{dq} \begin{bmatrix} i_{ur} \\ i_{vr} \\ i_{wr} \end{bmatrix} + C_{dq} \begin{bmatrix} \Delta i_u \\ \Delta i_v \\ \Delta i_w \end{bmatrix} = \begin{bmatrix} i_{dr} \\ i_{qr} \end{bmatrix} + \begin{bmatrix} \Delta i_d \\ \Delta i_q \end{bmatrix} \quad (4)$$

$$\begin{bmatrix} \Delta i_d \\ \Delta i_q \end{bmatrix} = C_{dq} \begin{bmatrix} \Delta i_u \\ \Delta i_v \\ \Delta i_w \end{bmatrix} = \sqrt{\frac{2}{3}} \Delta I_{amp} \begin{bmatrix} -\cos(\theta + \varphi) \\ \sin(\theta + \varphi) \end{bmatrix} \quad (5)$$

$$\Delta I_{amp} = \sqrt{\Delta i_u^2 + \Delta i_v^2 + \Delta i_w^2 - \Delta i_u \Delta i_v - \Delta i_v \Delta i_w - \Delta i_w \Delta i_u} \quad (6)$$

$$\begin{cases} \sin\varphi = \frac{\sqrt{3}}{2} \cdot \frac{1}{\Delta I_{amp}} (\Delta i_v - \Delta i_w) \\ \cos\varphi = \frac{1}{\Delta I_{amp}} \left( -\Delta i_u + \frac{\Delta i_v}{2} + \frac{\Delta i_w}{2} \right) \end{cases} \quad (7)$$

A description is now given of a problem to be solved by the present invention through use of $\Delta I_{amp}$, which is an element indicating a magnitude of the torque ripple given by Expression (6). It is assumed that when a current error per phase is equal to or larger than ε, an excessive torque ripple occurs. For example, when the current errors $\Delta i_u$, $\Delta i_v$, and $\Delta i_w$ the respective phases are given by $\Delta i_u = \varepsilon$, $\Delta i_v = 0$, and $\Delta i_w = 0$, respectively, an excessive torque ripple occurs.

The method described in Patent Literature 1 determines that a failure exists when a magnitude of the current error per phase is equal to or larger than a failure determination threshold value Ith. Therefore, the failure determination threshold value Ith for the current error per phase is defined as ε so as to be able to detect an excessive torque ripple. As a result, when each of the current errors $\Delta i_u$, $\Delta i_v$, and $\Delta i_w$ in the respective phases is equal to or larger than the failure determination threshold value ith=ε, an excessive torque ripple occurs, and a failure can thus be determined to exist. For example, when the current errors $\Delta i_u$, $\Delta i_v$, and $\Delta i_w$ in the respective phases are given by $\Delta i_u = \varepsilon$, $\Delta i_v = 0$, and $=\Delta i_w = 0$, respectively, a failure is determined to exist. At this time, $\Delta I_{amp}$, which is the element indicating the magnitude of the torque ripple, is $\Delta I_{amp} = \varepsilon$. Therefore, when $\Delta I_{amp}$ is equal to or larger than the failure determination threshold value Ith=ε, the torque ripple can be considered to be excessive.

Meanwhile, also when the current errors $\Delta i_u$, $\Delta i_v$, and $\Delta i_w$ in the respective phases are given by $\Delta i_u = \Delta i_v = \Delta i_w = \varepsilon$, the current errors $\Delta i_u$, $\Delta i_v$, and $\Delta w$ in the respective phases are equal to or larger than the failure determination threshold value ith=ε, and the method described in Patent Literature 1 thus determines that a failure exists. However, when $\Delta i_u = \Delta i_v = \Delta i_w = \varepsilon$, $\Delta I_{amp}$, which is the element indicating the magnitude of the torque ripple, is 0. That is, it is found that the d-axis detected current id and the q-axis detected current iq are not influenced by the current errors, and represent the values of the actual d axis current idr and the actual q axis current iqr. That is, a torque ripple due to the current errors does not occur. However, the method described in Patent Literature 1 uses the magnitude of the current error in each of the phases for the determination, and hence it is determined that a failure exist even when an excessive torque ripple does not occur. Thus, there is a problem in that the control of the motor is stopped, or the control method is changed.

Moreover, when $\Delta i_u = \Delta i_v = \varepsilon/2$, and $\Delta i_w = -\varepsilon/2$, the current errors $\Delta i_u$, $\Delta i_v$, and $\Delta i_w$ in the respective phases are smaller than the failure determination threshold value Ith=ε, and the method described in Patent Literature 1 thus does not determine that a failure exists. However, also in this case, $\Delta I_{amp} = \varepsilon$, and hence an excessive torque ripple having the same magnitude as that in the case in which $\Delta i_u = \varepsilon$, and $\Delta i_v = \Delta i_w = 0$, which are the current errors at which a failure is determined to exist, occurs. As described above, the method described in Patent Literature 1 has a problem in that a failure cannot be determined to exist even when an excessive torque ripple occurs.

Moreover, as described in Patent Literature 2, there is also a method of using a zero-phase current, that is, a sum of the currents in the respective phases, to determine whether or not a failure exists. In the method described in Patent Literature 2, it is determined that a failure exists when a sum Isum of the detected currents in the respective phases given by Expression (8) is equal to or larger than the failure determination threshold value Ith. This method uses the fact that Expression (9) is satisfied for the actual currents iur, ivr, and iwr in the respective phases under a normal state in which the current errors do not exist based on the Kirchhoff's circuit law.

$$I_{sum} = i_u + i_v + i_w \quad (8)$$

$$i_{ur} + i_{vr} + i_{wr} = 0 \quad (9)$$

The following three cases, which correspond to cases in which the current errors exist, are now examined.

First, the case in which $\Delta i_u = \varepsilon$, and $\Delta i_v = \Delta i_w = 0$ is examined. The sum Isum of the detected currents in the respective phases is Isum=ε as given by Expression (10). At this time, the excessive torque ripple occurs, and hence the failure can be determined to exist by setting the failure determination threshold value Ith to Ith=ε. Moreover, $\Delta I_{amp}$, which is the element indicating the magnitude of the torque ripple, is $\Delta I_{amp} = \varepsilon$.

$$I_{sum} = i_u + i_v + i_w = (i_{ur} + i_{vr} + i_{wr}) + (\Delta i_u + \Delta i_v + \Delta i_w) = \varepsilon + 0 + 0 = \varepsilon \quad (10)$$

The case in which $\Delta i_u = \Delta i_v = \Delta i_w = \varepsilon$ is now examined. The sum Isum of the detected currents in the respective phases is Isum=3ε as given by Expression (11). At this time, the sum Isum of the detected currents in the respective phases is equal to or larger than the failure determination threshold value Ith=ε, and hence a failure is determined to exist. However, $\Delta I_{amp}$, which is the element indicating the magnitude of the torque ripple, is 0, and hence a torque ripple does not occur. That is, there is a case in which a failure is determined to exist even when a torque ripple does not occur.

$$I_{sum} = i_u + i_v + i_w = (i_{ur} + i_{vr} + i_{wr}) + (\Delta i_u + \Delta i_v + \Delta i_w) = \varepsilon + \varepsilon + \varepsilon = 3\varepsilon \quad (11)$$

Further, the case in which $\Delta i_u = \varepsilon$, $\Delta i_v = -\varepsilon$, and $\Delta i_w = 0$ is examined. The sum Isum of the detected currents in the respective phases is Isum=0 as given by Expression (12), and hence the failure is not determined to exist. However, $\Delta I_{amp}$, which is the element indicating the magnitude of the torque ripple, is $\Delta I_{amp} = \sqrt{3}\varepsilon > \varepsilon$, and hence an excessive torque ripple occurs. That is, there is a case in which a failure cannot be determined to exist even when an excessive torque ripple occurs.

$$I_{sum}=i_u+i_v+i_w=(i_{ur}+i_{vr}+i_{wr})+(\Delta i_u+\Delta i_v+\Delta i_w)=\varepsilon-\varepsilon+0=0 \quad (12)$$

When a failure is determined to exist by using the above-mentioned method described in Patent Literature 1 or Patent Literature 2, the control of the motor is stopped, or the control is switched to backup control of not using the current values in respective phases that are determined to have a failure. Therefore, the methods described in Patent Literature 1 and Patent Literature 2 may erroneously determine that a failure exists even for current errors that do not cause a torque ripple. In that case, there is a problem in that a normal control method that has been executed until the failure is determined to exist cannot be continued. Moreover, there is a case in which a failure cannot be determined to exist for current errors that cause an excessive torque ripple. In that case, there is a problem in that the control of the motor cannot be stopped, or the control cannot be switched to the backup control.

The present invention has been made in view of the above-mentioned problems, and therefore has an object to obtain a control device for a motor and an electric power steering system, which are capable of avoid erroneously determining that a failure exists when current errors do not cause a torque ripple, to thereby be able to continue the control, and capable of reliably determining that a failure exists when current errors cause an excessive torque ripple.

Solution to Problem

According to one embodiment of the present invention, there is provided a control device for a motor configured to control a motor, the motor including windings in "m" phases, where "m" an integer of three or more, the control device including: a current control unit configured to input a current command value from an outside of the control device, and output a drive command so that a current detection value matches the current command value; a power converter, which includes an upper switching element and a lower switching element provided in correspondence to each of the phases of the motor, and is configured to control the upper switching elements and the lower switching elements to turn on and off in accordance with the drive command from the current control unit, to thereby supply electric power to the motor; a current sensor, which is connected in series to the lower switching element in each of the phases, and is configured to detect a current value in each of the phases to output the current value to the current control unit as the current detection value; and a failure determination unit configured to determine whether or not the current sensor has a failure, wherein, when each of the lower switching elements in at least "m−1" phases out of the "m" phases is turned off, the current sensor detects current errors in the at least "m−1 phases, wherein the failure determination unit is configured to calculate a current error determination value based on the current errors, and determine whether the current sensor has a failure based on the current error determination value, and wherein the current error determination value is calculated based on any one of: a magnitude of a sum of current error vectors in the respective phases each having a value of the current error in each of the phases as a magnitude; and values obtained by converting the current errors in the respective phases to Cartesian coordinates.

Advantageous Effects of Invention

With the control device for a motor according to the present invention, the magnitude of the torque ripple can be evaluated, to thereby be able to determine whether or not a failure exists, by calculating the current error determination value based on any one of; the magnitude of the sum of the current error vectors in the respective phases each having the value of the current error in each of the phases as the magnitude; and the values obtained by converting the current errors in the respective phases into the Cartesian coordinates. Therefore, it is possible inhibit a failure from being erroneously determined to exist for current errors that do not cause a torque ripple to continue the execution of the normal control, and it is possible to reliably determine that a failure exists for current errors that cause an excessive torque ripple.

DESCRIPTION OF EMBODIMENTS

First Embodiment

Figure 1:
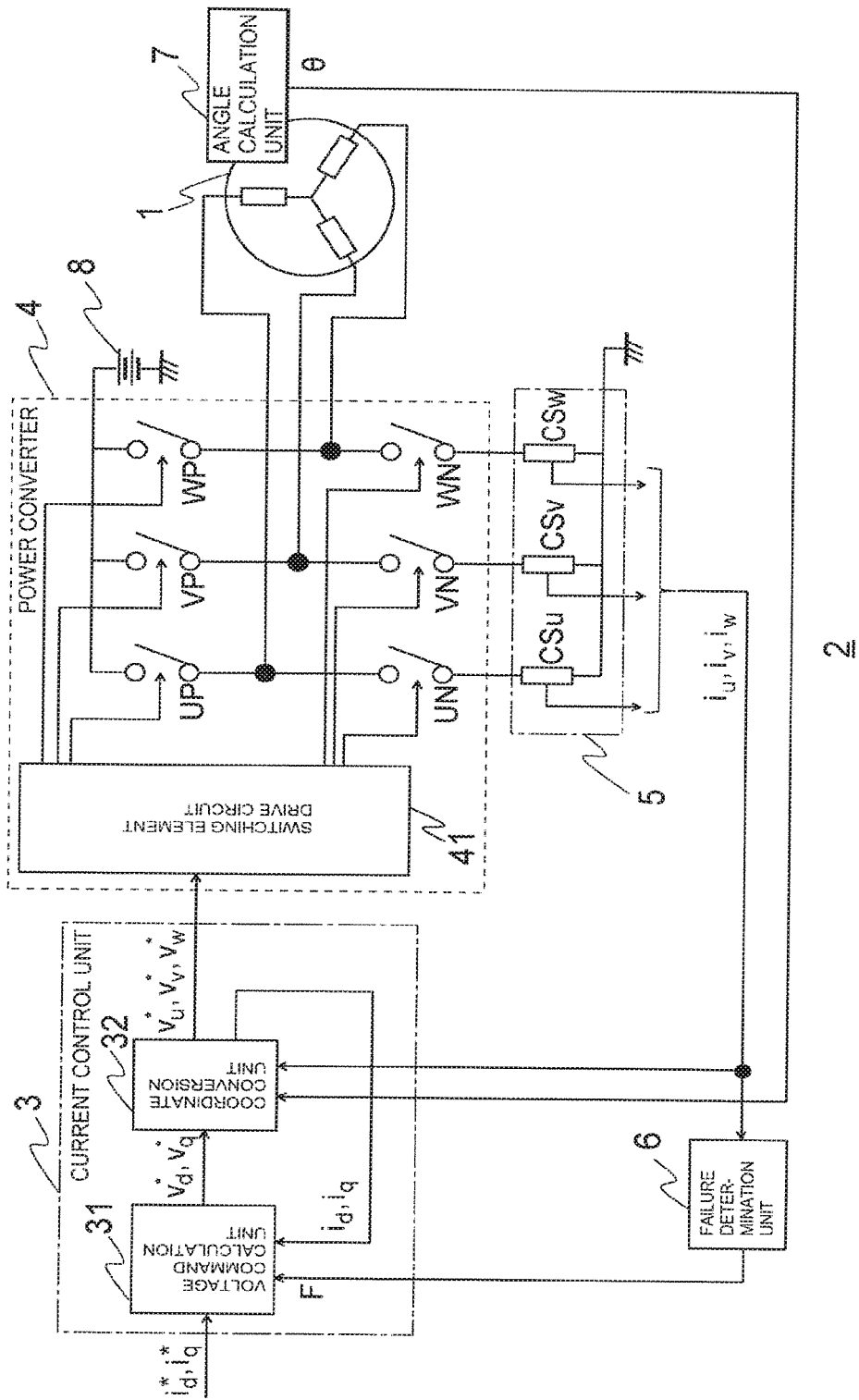
FIG. 1 is a block diagram for illustrating a configuration of a control device for a motor according to a first embodiment of the present invention.

FIG. 1 is a configuration diagram for illustrating a configuration of a control device for a motor according to a first embodiment of the present invention. The control device for a motor is hereinafter simply referred to as "control device 2". The control device 2 is configured to control a motor 1. The motor 1 is a motor including windings in "m" phases ("m" is an integer of three or more). As the motor 1, a generally well-known motor, such as a permanent magnet synchronous motor or an induction motor, may be used. In the first embodiment, a description is given of, as an example, a case in which the motor its formed of a three-phase AC permanent magnet synchronous motor as a motor including three-phase windings U, V, and W.

The control device 2 includes a current control unit 3, a power converter 4, a current sensor 5, a failure determination unit 6, and an angle calculation unit 7.

The current control unit 3 includes a voltage command calculation unit 31 and a coordinate conversion unit 32.

A d-axis current command id* and u q-axis current command iq* are input from the outside to the voltage command calculation unit 31. A d-axis detected current id and a q-axis detected current iq are input from the coordinate conversion unit 32 to the current command calculation unit 31. The voltage command calculation unit 31 is configured to generate a d-axis voltage command vd* and a g-axis voltage command vq* so that the d-axis current command id* and the g-axis current command iq* and the d-axis detected current id and the q-axis detected current iq match each other in respective axis components.

The d-axis voltage command vd*, the q-axis voltage command vq*, and an angle signal θ output from the angle calculation unit 7 are input to the coordinate conversion unit 32. The coordinate conversion unit 32 is configured to apply coordinate conversion to the d-axis voltage command vd* and the q-axis voltage command vq* based on the angle signal θ, to thereby generate a u-phase voltage command vu*, a v-phase voltage command vv*, and a w-phase voltage command vw*. The u-phase voltage command vu*, the v-phase voltage command vv*, and the w-phase voltage command vw* are input to the power converter 4 as a drive command.

Further, a U-phase detected current iu, a V-phase detected current iv, and a W-phase detected current iw, which are output from the current sensor 5, are input to the coordinate conversion unit 32. The coordinate conversion unit 32 is configured to apply coordinate conversion to the u-phase detected current iu, the v-phase detected current iv, and the w-phase detected current iw based on the angle signal θ, to thereby generate the d-axis detected current id and the q-axis detected current iq. The d-axis detected current id and the c-axis detected current iq are input to the voltage command calculation unit 31.

A DC power supply 8 is configured to output a DC voltage Vdc to the power converter 4.

The power converter 4 includes a plurality of switching elements, and a switching element drive circuit 41 configured to apply on/off control to the plurality of switching elements. The power converter 4 is configured to use the DC voltage Vdc from the DC power supply 8, and apply the on/off control to the plurality of switching elements through the switching element drive circuit 41 based on the u-phase voltage command vu*, the v-phase voltage command vv*, and the w-phase voltage command vw* from the current control unit 3, to thereby supply electric power to the motor 1. The plurality of switching elements are provided in correspondence to the respective phases of the three phases of the U phase, the V phase, and the W phase of the motor 1. The plurality of switching elements include upper switching elements UP, VP, and WP, and lower switching elements UN, VN, and WN. The upper switching elements UP, VP, and WP and the lower switching elements UN, VN, and WN are connected in series to each other in the respective phases. As each of the switching elements, a switching element formed of a semiconductor switch such as an IGET, a bipolar transistor, and a MOS power transistor and a diode inversely connected to the semiconductor switch in parallel is used.

Phase current sensors CSu, CSv, and CSw for detecting the currents in the respective phases are provided in the current sensor 5. The phase current sensors CSu, CSv, and CSw are connected in series to the lower switching elements UN, VN, and WN on a low electric potential side (ground side) in the respective phases. The phase current sensors CSu, CSv, and CSw are formed of, for example, current detection resistor devices Ru, Rv, and Rw, and amplifiers, for example, operational amplifiers, provided for the respective current detection resistor devices Ru, Rv, and Rw. The phase current detection sensors CSu, CSv, and CSw are configured to acquire values obtained by using the amplifiers to amplify voltages between both ends of the current detection resistor devices Ru, Rv, and Rv, as the values of the currents in the respective phases. The phase current sensors CSu, CSv, and CSw acquires the values of the currents in the respective phases when the lower switching elements UN, UN, WN in the respective phases are each turned on, and outputs the values as the detected currents iu, iv, and iw. Further, the phase current sensors CSu, CSv, and CSw acquires the values of the currents in the respective phases when the lower switching elements UN, VN, and WN in the respective phases are each turned off, and outputs the values as current errors Δiu, Δiv, and Δiw in the respective phases. When the lower switching elements UN, VN, and WN in the respective phases are each turned off, the values of the currents detected by the respective phase current sensors CSu, CSv, and CSw are each theoretically supposed to be zero. Therefore, when a value other than zero is detected while the lower switching elements UN, VN, and WN in the respective phases are each turned off, the value indicates the current error contained in the value of the current detected by each of the phase current sensors CSu, CSv, and CSw. For example, when resistance values of the current detection resistor devices Ru, Rv, and Rw are not uniform due to variation caused by individual differences, or the resistance values have changed due to temperature characteristics, the current error occurs.

The angle calculation unit 7 is configured to detect the rotation angle of the motor 1, and output the angle signal θ. The angle calculation unit 7 is formed of an angle sensor, for example, a resolver. The angle calculation unit 7 outputs the value detected by the angle sensor as the angle signal θ. The angle signal θ is input to the coordinate conversion unit 32.

The failure determination unit 6 is configured to determine whether or not the current sensor 5 has a failure.

A description is now given of the failure determination unit 6. The current errors Δiu, Δiv, and Δiw in the respective phases are input from the current sensor 5 to the failure determination unit 6. The failure determination unit 6 is configured to calculate a current error determination value ΔIj based on the current errors Δiu, Δiv, and Δiw in the respective phases, and determine whether or not the current sensor 5 has a failure based on the current error determination value ΔIj.

A description is now given of the current error determination value ΔIj. Current error vectors:
$$\vec{\Delta i_u}, \vec{\Delta i_v}, \vec{\Delta i_w}$$
in the respective phases having positive/negative signs and magnitudes of the current errors Δiu, Δiv, and Δiw the respective phases are given by Expression (13). The unit vectors:
$$\vec{u}, \vec{v}, \vec{w}$$
correspond to the U phase, V phase, and the W phase, respectively. The V phase leads the U phase by 120 degrees. The W phase lags behind the U phase by 120 degrees.

$$\begin{cases} \vec{\Delta i_u} = \Delta i_u \cdot \vec{u} \\ \vec{\Delta i_v} = \Delta i_v \cdot \vec{v} \\ \vec{\Delta i_w} = \Delta i_w \cdot \vec{w} \end{cases} \quad (13)$$

The current error determination value ΔIj is determined based on a magnitude:
$$|\vec{\Delta I}|$$
of a current error resultant vector:
$$\vec{\Delta I},$$
which is a sum of the current error vectors in the respective phases:
$$\vec{\Delta i_u}, \vec{\Delta i_v}, \vec{\Delta i_w}$$

Figure 2:
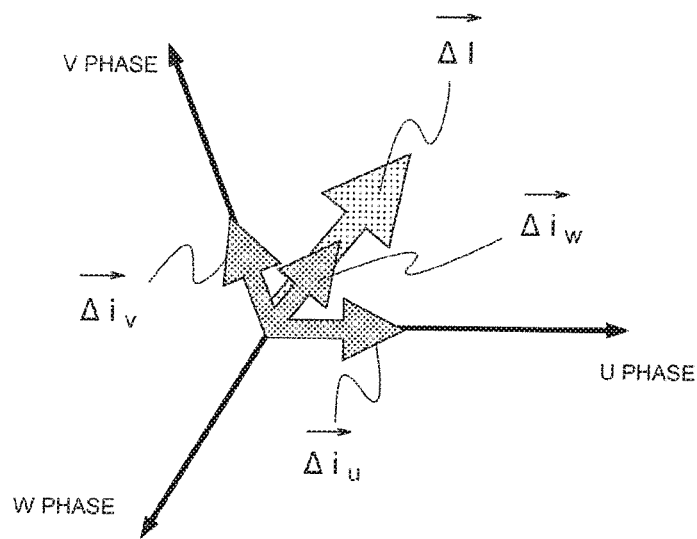
FIG. 2 is a diagram for illustrating an example of current error vectors in respective phases and a current error resultant vector in the first embodiment of the present invention.

The current error resultant vector:
$\vec{\Delta I}$
is given by Expression (14). FIG. 2 is a diagram for illustrating an example of the current error vectors in the respective phases and the current error resultant vector. In FIG. 2, a case in which the current errors $\Delta i_u$, $\Delta i_v$, and $\Delta i_w$ in the respective phases are given by $\Delta i_u = \varepsilon$, $\Delta i_v = \varepsilon$, and $\Delta i_w = -\varepsilon$, respectively, is illustrated.

$$\vec{\Delta I} = \vec{\Delta i_u} + \vec{\Delta i_v} + \vec{\Delta i_w} \qquad (14)$$

Figure 3:
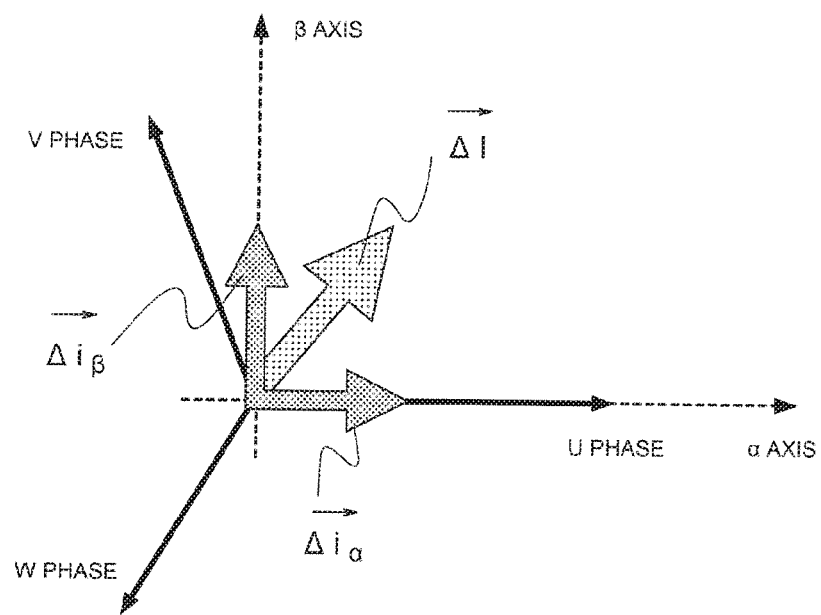
FIG. 3 is an example of a vector diagram for illustrating current error vectors on an α axis and β axis, which are fixed Cartesian coordinate axes, and the current error resultant vector in the first embodiment of the present invention.

In order to obtain the magnitude:
$|\vec{\Delta I}|$
of the current error resultant vector:
$\vec{\Delta I}$,
the current errors $\Delta i_u$, $\Delta i_v$, and $\Delta i_w$ in the respective phases are converted to currents on an $\alpha$ axis and a $\beta$ axis, which are fixed Cartesian coordinate axes. FIG. 3 is an example of a vector diagram for illustrating the current error vectors on the $\alpha$ axis and the $\beta$ axis, which are the fixed Cartesian coordinate axes, and the current error resultant vector. The currant error vectors on the $\alpha$ axis and the $\beta$ axis:
$\vec{\Delta i_\alpha}, \vec{\Delta i_\beta}$
are obtained by applying, to the current error vectors in the respective phases:
$\vec{\Delta i_u}, \vec{\Delta i_v}, \vec{\Delta i_w}$,
coordinate conversion to the $\alpha$ axis and the $\beta$ axis. The current error vectors on the $\alpha$ axis and the $\beta$ axis:
$\vec{\Delta i_\alpha}, \vec{\Delta i_\beta}$
are given by Expression (15) through use of unit vectors:
$\vec{\alpha}, \vec{\beta}$
corresponding to the $\alpha$ axis and the $\beta$ axis.
In Expression (15), the current errors on the $\alpha$ axis and the $\beta$ axis:
$\Delta i_\alpha, \Delta i_\beta$
is given by Expression (16).
In Expression (16), "Cab" represents a conversion matrix for the coordinate conversion from the current errors $\Delta i_u$, $\Delta i_v$, and $\Delta i_w$ in the respective phases to current errors $\Delta i\alpha$ and $\Delta i\beta$ on the $\alpha$ axis and the $\beta$ axis, and is given by Expression (17).

$$\begin{cases} \vec{\Delta i_\alpha} = \Delta i_\alpha \cdot \vec{\alpha} \\ \vec{\Delta i_\beta} = \Delta i_\beta \cdot \vec{\beta} \end{cases} \qquad (15)$$

$$\begin{bmatrix} \Delta i_\alpha \\ \Delta i_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} \Delta i_u \\ \Delta i_v \\ \Delta i_w \end{bmatrix} = C_{ab} \begin{bmatrix} \Delta i_u \\ \Delta i_v \\ \Delta i_w \end{bmatrix} \qquad (16)$$

$$C_{ab} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \qquad (17)$$

In this case, the current error resultant vector:
$\vec{\Delta I}$
is given by Expression (18). The magnitude:
$|\vec{\Delta I}|$
of the current error resultant vector:
$\vec{\Delta I}$
is obtained by Expression (19).

$$\vec{\Delta I} = \vec{\Delta i_\alpha} + \vec{\Delta i_\beta} \qquad (18)$$

$$\begin{aligned}|\vec{\Delta I}| &= \sqrt{\Delta i_\alpha^2 + \Delta i_\beta^2} \qquad (19)\\ &= \sqrt{\frac{2}{3}} \cdot \sqrt{\left(\Delta i_u - \frac{1}{2}\Delta i_v - \frac{1}{2}\Delta i_w\right)^2 + \left(\frac{\sqrt{3}}{2}\Delta i_v - \frac{\sqrt{3}}{2}\Delta i_w\right)^2} \\ &= \sqrt{\frac{2}{3}} \cdot \sqrt{\Delta i_u^2 + \Delta i_v^2 + \Delta i_w^2 - \Delta i_u \Delta i_v - \Delta i_v \Delta i_w - \Delta i_w \Delta i_u} \\ &= \sqrt{\frac{2}{3}} \cdot \Delta I_{amp} \end{aligned}$$

From the description given above, the current error determination value $\Delta Ij$ is given by Expression (20), which is based on the magnitude:
$|\vec{\Delta I}|$
of the current error resultant vector:
$\vec{\Delta I}$,
which is the sum of the vectors in the respective phases having the current errors in the respective phases as the magnitude. In Expression (20), the current error determination value $\Delta Ij$ is calculated based on a sum of squares: $(\Delta i_u^2 + \Delta i_v^2 + \Delta i_w^2)$
of the current errors in the respective phases. The value given by Expression (20) is the same as $\Delta I_{amp}$, which is the element indicating the magnitude of the torque ripple given by Expression (6), and can thus be used to appropriately detect such a failure that the torque ripple is excessively large.

$$\Delta I_j = \sqrt{\Delta i_u^2 + \Delta i_v^2 + \Delta i_w^2 - \Delta i_u \Delta i_v - \Delta i_v \Delta i_w - \Delta i_w \Delta i_u} \qquad (20)$$

A description is now given of an effect of the first embodiment of the present invention while the first embodiment is compared with a related-art method described in Patent Literature 1 in order to describe the effect in a plain manner. The description is given assuming that an excessive torque ripple to be determined as a failure is occurring when the current error per phase is equal to or larger than $\varepsilon$.

First, in the first embodiment, the failure determination threshold value Ith is set to Ith=$\varepsilon$ so that the current error determination value $\Delta Ij$ given by Expression (20) can be used to determine that a failure exists under the condition of $\Delta i_u = \varepsilon$, and $\Delta i_v = \Delta i_w = 0$, which is determined as a failure by the method described in Patent Literature 1. When $\Delta i_u = \varepsilon$, and $\Delta i_v = \Delta i_w = 0$, the current error determination value $\Delta Ij$ is given by Expression (21). Such a condition $\Delta Ij \geq Ith$ is thus satisfied, and a failure can be determined to exist also in the first embodiment in the same manner as in the related-art method described in Patent Literature 1.

$$\Delta I_j = \sqrt{\Delta i_u^2 + \Delta i_v^2 + \Delta i_w^2 - \Delta i_u \Delta i_v - \Delta i_v \Delta i_w - \Delta i_w \Delta i_u} = \sqrt{\varepsilon^2} = \varepsilon \qquad (21)$$

A description is now given of the effect with a case in which $\Delta i_u = \Delta i_v = \Delta i_w = \varepsilon$ as an example. The current errors $\Delta i_u$, $\Delta i_v$, and $\Delta i_w$ in the respective phases are each equal to or larger than the failure determination threshold value Ith=$\varepsilon$, and the method described in Patent Literature 1 thus determines that a failure exists. Meanwhile, a failure is not determined to exist in the first embodiment. A description is now given of a reason for that. As described above, $\Delta I_{amp} = 0$ in accordance with Expression (6) when the same current errors exist in the respective phases, and a torque ripple does not thus occur. Moreover, the current error determination value ΔIj set in Expression (20) is 0 as given by Expression (22), and hence a failure is not determined to exist. That is, in the first embodiment, a failure is not determined to exist for current errors that do not cause occurrence of a torque ripple, and the control of the motor can thus be continued.

$$\Delta I_j = \sqrt{\Delta i_u^2 + \Delta i_v^2 + \Delta i_w^2 - \Delta i_u \Delta i_v - \Delta i_v \Delta i_w - \Delta i_w \Delta i_u} = \sqrt{3 \cdot \varepsilon^2 - 3 \cdot \varepsilon^2} 0 \quad (22)$$

Further, a description is now given of the effect with a case in which Δiu=Δiv=ε/2 Δiw=−ε/2 as an example. The current errors Δiu, Δiv, and Δiw in the respective phases are each smaller than the failure determination threshold value Ith=ε, and the method described in Patent Literature 1 does not thus determine that a failure exists. Meanwhile, a failure is determined to exist in the first embodiment. A description is now given of a reason for that. ΔIamp is ε in accordance with Expression (6), and the magnitude of the torque ripple to occur is the same as the level determined so that a failure exists. Thus, an excessive torque ripple occurs. The current error determination value ΔIj set in Expression (20) is ε as given by Expression (23), and is equal to or larger than the failure determination threshold value Ith=ε, and a failure can thus be determined to exist. In such a manner, in the first embodiment, the determination for the failure of the current sensor 5 can appropriately be made through use of the current error determination value ΔIj set based on the magnitude of the torque ripple to occur.

$$\Delta I_j = \sqrt{\Delta i_u^2 + \Delta i_v^2 + \Delta i_w^2 - \Delta i_u \Delta i_v - \Delta i_v \Delta i_w - \Delta i_w \Delta i_u} = \sqrt{4 \cdot \left(\frac{\varepsilon}{2}\right)^2} = \varepsilon \quad (23)$$

Figure 4:
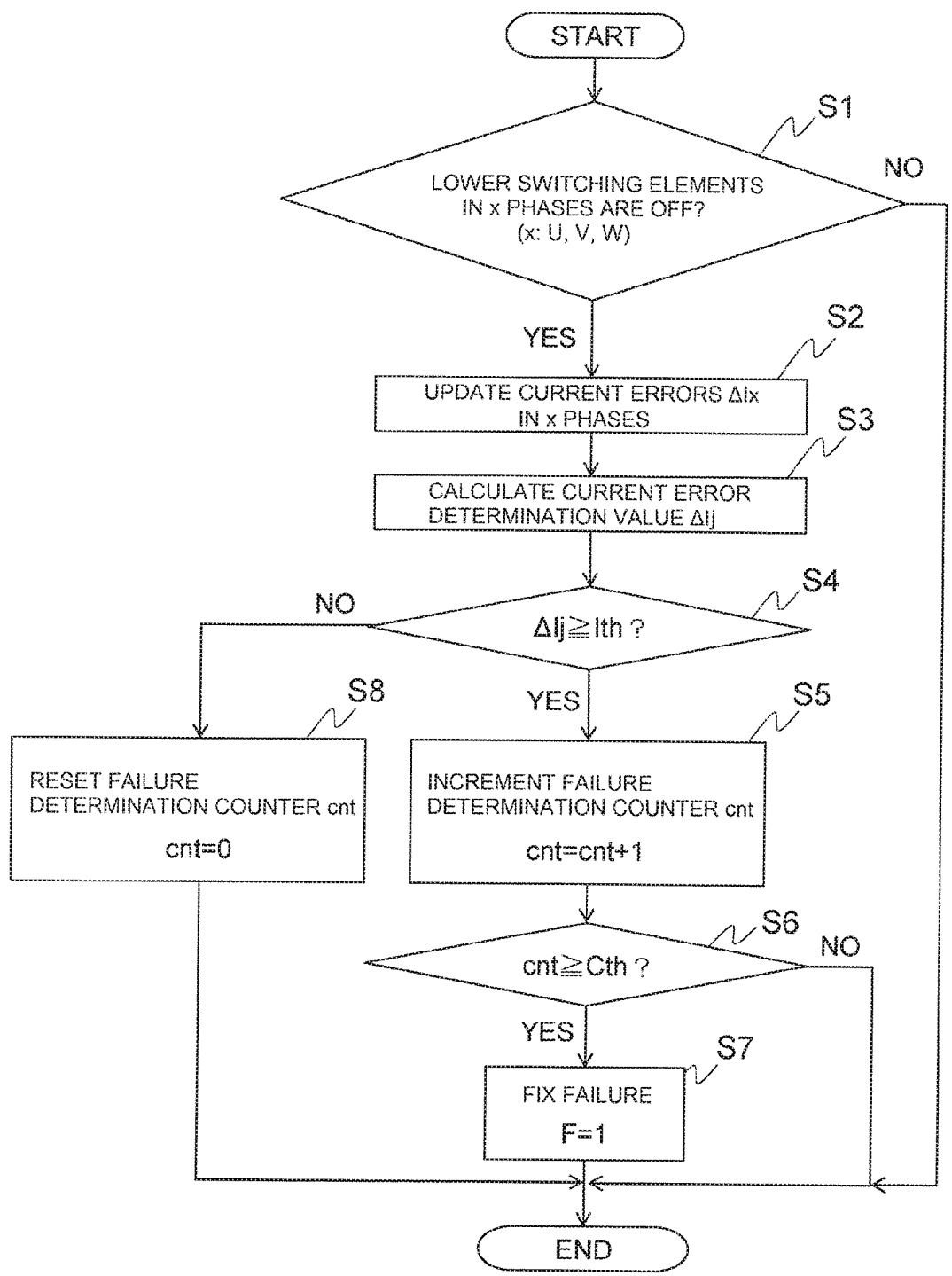
FIG. 4 is a flowchart for illustrating failure determination processing to be executed by a failure determination unit in the first embodiment of the present invention.

A description is now given of processing to be executed by the failure determination unit 6. FIG. 4 is a flowchart for illustrating a flow of the processing for the failure determination to be executed by the failure determination unit 6. In FIG. 4, an initial value of a failure determination counter cnt in the failure determination unit 6 is zero, and an initial state of a failure fixing flag F is OFF (F=0).

In FIG. 4, first, in Step S1, it is determined whether or not the lower switching elements in x phases (x phases: U phase, V phase, and W phase) are turned off in order to acquire current errors in the respective phases. That is, it is determined whether or not all of the lower switching elements in the U phase, the V phase, and the W phase are turned off.

When all of the lower switching elements in the x phases are turned off (YES in Step S1), in Step S2, the current errors ΔIx in the x phases are acquired from the current sensor 5, and the values of the current errors ΔIx in the x phases are updated. Then, the processing proceeds to Step S3.

Otherwise (NO in Step S1), the processing is immediately finished.

In Step S3, the current error determination value ΔIj is calculated, and the processing proceeds to Step S4.

In Step S4, it is determined whether or not the current error determination value ΔIj is equal to or larger than the failure determination threshold value Ith.

When the current error determination value ΔIj is equal to or larger than the failure determination threshold value Ith (YES in Step S4), in Step S5, the failure determination counter cnt is incremented. Then, the processing proceeds to Step S6.

Meanwhile, when the current error determination value ΔIj is smaller than the failure determination threshold value Ith (NO in Step S4), in Step S8, the failure determination counter cnt is reset so that cnt becomes 0. Then, the processing is finished.

In Step S6, it is determined whether or not the failure determination counter cnt is equal to or larger than a failure fixing threshold value Cth set in advance.

When the failure determination counter cnt is equal to or larger than the failure fixing threshold value Cth (YES in Step S5), in Step S7, a failure is determined to exist, and the failure fixing flag F is set to ON (F=1).

Meanwhile, when the failure determination counter cnt is smaller than the failure fixing threshold value Cth (NO in Step S6), the processing is immediately finished.

The failure determination unit 6 makes the failure determination in such a manner, and transmits the failure fixing flag F obtained by the failure determination to the voltage command calculation unit 31 of the current control unit 3.

In the description given above, it is determined in Step S1 of FIG. 4 whether or not all of the lower switching elements in the U phase, the V phase, and the W phase are turned off. However, the determination is not limited to this example, and it may be determined whether or not the lower switching elements in at least two phases out of the U phase, the V phase, and the W phase are turned off. That is, when the motor 1 has "m" phases, it may be determined whether or not the lower switching elements in at least "m−1" phases out of the "m" phases are turned off.

The current control unit 3 stops the control of the motor 1 in response to the state in which the failure fixing flag F has become ON (F=1). As a result, the operation of the motor 1 is stopped. Alternatively, when the control is desired to be continued without stopping the control of the motor 1, the control method may be changed from the normal control method to a backup control method. It is assumed that the backup control method is a control method without using the detected currents iu, iv, and iw in the respective phases, in an example of the backup control method, for example, the current control unit 3 obtains estimated current idest and iqest given by Expression (24), based on the d-axis voltage command vd* and the q-axis voltage command vq* in place of the d-axis detected current id and the q-axis detected current iq calculated from the detected currents iu, iv, and iw in the respective phases, and uses the estimated currents idest and iqest to execute the current control. In Expression (24), ω represents a speed obtained by differentiating the angle signal θ, φ represents a magnetic flux, R represents a resistance value, L represents an inductance, and s represents a differential operator.

$$\begin{bmatrix} i_{dest} \\ i_{qest} \end{bmatrix} = \begin{bmatrix} R + L \cdot s & -\omega \cdot L \\ \omega \cdot L & R + L \cdot s \end{bmatrix}^{-1} \begin{bmatrix} v_d^* \\ v_q^* - \omega \cdot \phi \end{bmatrix} \quad (24)$$

In such a manner, in the first embodiment, when the failure determination unit 6 determines that the current sensor 5 has a failure, an abnormal behavior of the motor 1 is prevented by stopping the control of the motor 1, or changing the control method therefor.

As described above, the control device 2 according to the first embodiment includes the current control unit 3 configured to generate the drive command based on a current command value input from the outside, the power converter 4 configured to control the upper switching elements and the lower switching elements to turn on and off in accordance with the drive command from the current control unit 3, to thereby supply the electric power to the motor 1, the current sensor 5 arranged in series to the lower switching elements in the respective phases, and the failure determination unit 6 configured to determine whether or not the current sensor 5 has a failure. Moreover, the motor 1 has the windings in the "m" phases.

The current sensor 5 is configured to detect the currents in the respective phases, and detect the current errors Δiu, Δiv, and Δiw in the respective phases when at least "m−1" lower switching elements in the phases are each turned off. The failure determination unit 6 is configured to calculate the current error determination value ΔIj based on the current errors Δiu, Δiv, and Δiw in the respective phases, and determine whether or not the current sensor 5 has a failure based on the current error determination value ΔIj. The current error determination value ΔIj is calculated based on the magnitude of the sum of the current error vectors in the respective phases having the current errors Δiu, Δiv, and Δiw in the respective phases as the magnitudes thereof, or the values of Cartesian coordinates obtained by converting the current errors Δiu, Δiv, and Δiw in the respective phases. In the first embodiment, as given by Expression (20), the current error determination value ΔIj is calculated based on the sum of the squares of the current errors in the respective phases as the magnitude of the sum of the current error vectors in the respective phases having the current errors Δiu, Δiv, and Δiw in the respective phases as the magnitudes thereof.

With this configuration, when the lower (low electric potential side) switching elements in the respective phases are each turned off, the detected values of the currents are theoretically zero, and hence the values of the current errors Δiu, Δiv, and Δiw can be acquired by acquiring the values detected when the switching elements are turned off. Through use of the magnitude of the sum of the current error vectors in the respective phases having the current errors Δiu, Δiv, and Δiw in the respective phases as the magnitudes thereof, or the values on the α axis and the β axis obtained by converting the current errors in the respective phases, which are the fixed Cartesian coordinates, to determine whether or not the current sensor 5 has a failure, the magnitude of the torque ripple is evaluated to be able to determine the absence/presence of a failure. As a result, for values of the current errors Δiu, Δiv, and Δiw that do not cause a torque ripple, the control can be continued through use of the normal control method without stopping the control of the motor 1, or changing the control method therefor. Meanwhile, for the current errors Δiu, Δiv, and Δiw that cause an excessive torque ripple, the current sensor 5 is determined to have a failure, to thereby be able to stop the control of the motor 1, or change the control method from the normal control method to the backup control method. In such a manner, in the first embodiment, the determination of the absence/presence of the failure of the current sensor 5 can appropriately be made, and the motor 1 can thus stably be controlled without an occurrence of an excessive torque ripple.

Even when the lower switching elements UN, VN, and WN are turned off, the values of the currents detected in the respective phases may not be zero due to regeneration by the motor 1 depending on the configurations of the motor 1 and the power converter 4 and an operation state of the motor 1, and consequently the current errors Δiu, Δiv, and Δiw in the respective phases cannot accurately be acquired. This is a case in which the upper switching elements UP, VP and WP in the respective phases are turned off and the lower switching elements UN, VN, and WN corresponding to the upper phases, in which the upper switching elements are turned off, are turned off. For example, this case includes a case in which the upper switching element UP and the lower switching element UN in the U phase are turned off. In the case of a configuration susceptible to the influence of the regeneration, the current errors Δiu, Δiv, and Δiw in the respective phases can more precisely be acquired by adding a condition corresponding to a state in which the rotation speed of the motor 1 is low as the condition for updating the current errors Δiu, Δiv, and Δiw in the respective phases. Moreover, the current errors Δiu, Δiv, and Δiw in the respective phases may be updated only when the upper switching elements UP, VP and WP in the respective phases are turned on and the lower switching elements UN, VN, and WN corresponding to the upper phases, in which the upper switching elements are turned on, are turned off. In such a case, specifically, for example, the current error in the U phase is updated only when the upper switching element UP in the U phase is turned on and the lower switching element UN in the U phase is turned off.

The current error determination value ΔIj may be set based on the converted values on the α axis and the β axis, which are the fixed Cartesian coordinate axes. In Expression (19), when the magnitude:

$|\overrightarrow{\Delta I}|$ of the current error resultant vector:

$\overrightarrow{\Delta I}$ is obtained, the current error determination value ΔIj is calculated through use of Expression (25) based on, as intermediate variables, the converted values ΔIα and ΔIβ on the α axis and the β axis, which are the fixed orthogonal coordinate axes, and the failure can thus be determined through use of a value similarly indicating the magnitude of the torque ripple. In this case, similar determination can be made by setting the failure determination threshold value Ith to Ith=(√(⅔))×ε, and determining that a failure exists when the current error determination value ΔIj is equal to or larger than the failure determination threshold value Ith.

$$\Delta I_j = \sqrt{\Delta i_\alpha^2 + \Delta i_\beta^2} \qquad (25)$$

In such a manner, whether or not a failure exists is determined through use of the current error determination value ΔIj calculated based on the sum of the squares of the current errors converted to the orthogonal coordinates, to thereby be able to determine that a failure exists by evaluating the magnitude of the torque ripple. As a result, for values of the current errors that do not cause a torque ripple, the control of the motor 1 can be continued without stopping the control or changing the control method therefor. Meanwhile, for the current errors that cause an excessive torque ripple, the current sensor 5 can be determined to have a failure, to thereby be able to stop the control of the motor 1 or change the control method therefor. In such a manner, in the first embodiment, the determination of the failure of the current sensor 5 can appropriately be made, and the motor 1 can thus stably be controlled without occurrence of an excessive torque ripple.

Moreover, as given by Expression (26) and Expression (27), values obtained without calculating the square root can be used as the current error determination value ΔIj for the sake of simpler calculation. In this case, it may be determined that a failure exists when the current error determination value ΔIj is equal to or larger than a value (=Ith²) obtained by squaring the failure determination threshold value Ith in the case of including the calculation of the square root.

$$\Delta I_j = \Delta i_u^2 + \Delta i_v^2 + \Delta i_w^2 - \Delta i_u \Delta i_v - \Delta i_v \Delta i_w - \Delta i_w \Delta i_u \qquad (26)$$

$$\Delta I_j = \Delta i_\alpha^2 + \Delta i_\beta^2 \qquad (27)$$

In the first embodiment, the current error determination value ΔIj is set based on the magnitude:

$|\overrightarrow{\Delta I}|$ the current error resultant vector:

$\overrightarrow{\Delta I}$, which is the sum of the vectors in the respective phases having the current errors in the respective phases as the magnitudes thereof. However, the magnitude:

$|\overrightarrow{\Delta I}|$ of the current error resultant vector:

$\overrightarrow{\Delta I}$ may be calculated based on a sum of squares of values obtained by subtracting an average value Δiavg of the current errors in the respective phases from each of the current errors Δiu, Δiv, and Δiw in the respective phases. The average value Δiavg is obtained as below.

$$\Delta i\,avg = (\Delta iu + \Delta iv + \Delta iw)/3 \qquad (28)$$

Thus, the square root of the sum of the squares of the values obtained by subtracting the average value Δiavg from the current errors in the respective phases is obtained through use of Expression (29). In Expression (29), ΔIamp represents a value indicating the magnitude of the torque ripple, and appropriate failure detection can thus be achieved in the same manner as described above also with this method. In this case, it is only required that the failure determination threshold value Ith be set to Ith=(√(⅔))×ε.

$$\Delta I_j = \sqrt{(\Delta i_u - \Delta i_{avg})^2 + (\Delta i_v - \Delta i_{avg})^2 + (\Delta i_w - \Delta i_{avg})^2} \qquad (29)$$

$$= \sqrt{\left(\Delta i_u - \frac{\Delta i_u + \Delta i_v + \Delta i_w}{3}\right)^2 + \left(\Delta i_v - \frac{\Delta i_u + \Delta i_v + \Delta i_w}{3}\right)^2 + \left(\Delta i_w - \frac{\Delta i_u + \Delta i_v + \Delta i_w}{3}\right)^2}$$

$$= \sqrt{\frac{2}{3}} \cdot \sqrt{\Delta i_u^2 + \Delta i_v^2 + \Delta i_w^2 - \Delta i_u \Delta i_v - \Delta i_v \Delta i_w - \Delta i_w \Delta i_u}$$

$$= \sqrt{\frac{2}{3}} \cdot \Delta I_{amp}$$

In such a manner, the magnitude of the torque ripple can be evaluated to be able to determine whether or not a failure exists by calculating the sum of the squares of the values obtained by subtracting the average value from each of the current errors in the respective phases as the magnitude of the current error resultant vector, which is the sum of the current error vectors in the respective phases. As a result, the failure of the current sensor 5 can appropriately be determined, and the motor can thus stably be controlled without occurrence of an excessive torque ripple.

Moreover, the current error determination value ΔIj is set so as to be based on the magnitude:

$|\overrightarrow{\Delta I}|$ of the current error resultant vector:

$\overrightarrow{\Delta I}$, which is the sum of the vectors in the respective phases having the current errors in the respective phases as the magnitudes thereof. However, the magnitude:

$|\overrightarrow{\Delta I}|$ of the current error resultant vector:

$\overrightarrow{\Delta I}$ may be calculated based on a sum of squares of differences between the current errors in respective two phases out of the respective phases. A square root of the sum of the squares of the differences between the current errors in the respective two phases out of the respective phases is given by Expression (30). In Expression (30), ΔIamp represents a value indicating the magnitude of the torque ripple, and appropriate failure detection can thus be achieved in the same manner as described above also with this method. In this case, it is only required that the failure determination threshold value ith be set to Ith=(√2)×ε.

$$\Delta I_j = \sqrt{(\Delta i_u - \Delta i_v)^2 + (\Delta i_v - \Delta i_w)^2 + (\Delta i_w - \Delta i_u)^2} \qquad (30)$$

$$= \sqrt{2} \cdot \sqrt{\Delta i_u^2 + \Delta i_v^2 + \Delta i_w^2 - \Delta i_u \Delta i_v - \Delta i_v \Delta i_w - \Delta i_w \Delta i_u}$$

$$= \sqrt{2} \cdot \Delta I_{amp}$$

In such a manner, the magnitude of the torque ripple can be evaluated to be able to determine whether or not a failure exists by calculating, based on the sum of the squares of differences between the current errors in the two phases, the magnitude of the current error resultant vector, which is the sum of the current error vectors in the respective phases. As a result, the failure can appropriately be determined, and the motor can thus stably be controlled without occurrence of an excessive torque ripple.

As described above, the magnitude of the torque ripple can be evaluated to be able to determine whether or not the current sensor 5 has a failure by obtaining the current error determination value ΔIj through use of any one of Expressions (20), (25), (26) (27), (29), and (30) described in the first embodiment. As a result, a failure can appropriately be determined, and the motor 1 can thus stably be controlled without occurrence of an excessive torque ripple.

Second Embodiment

Figure 5:
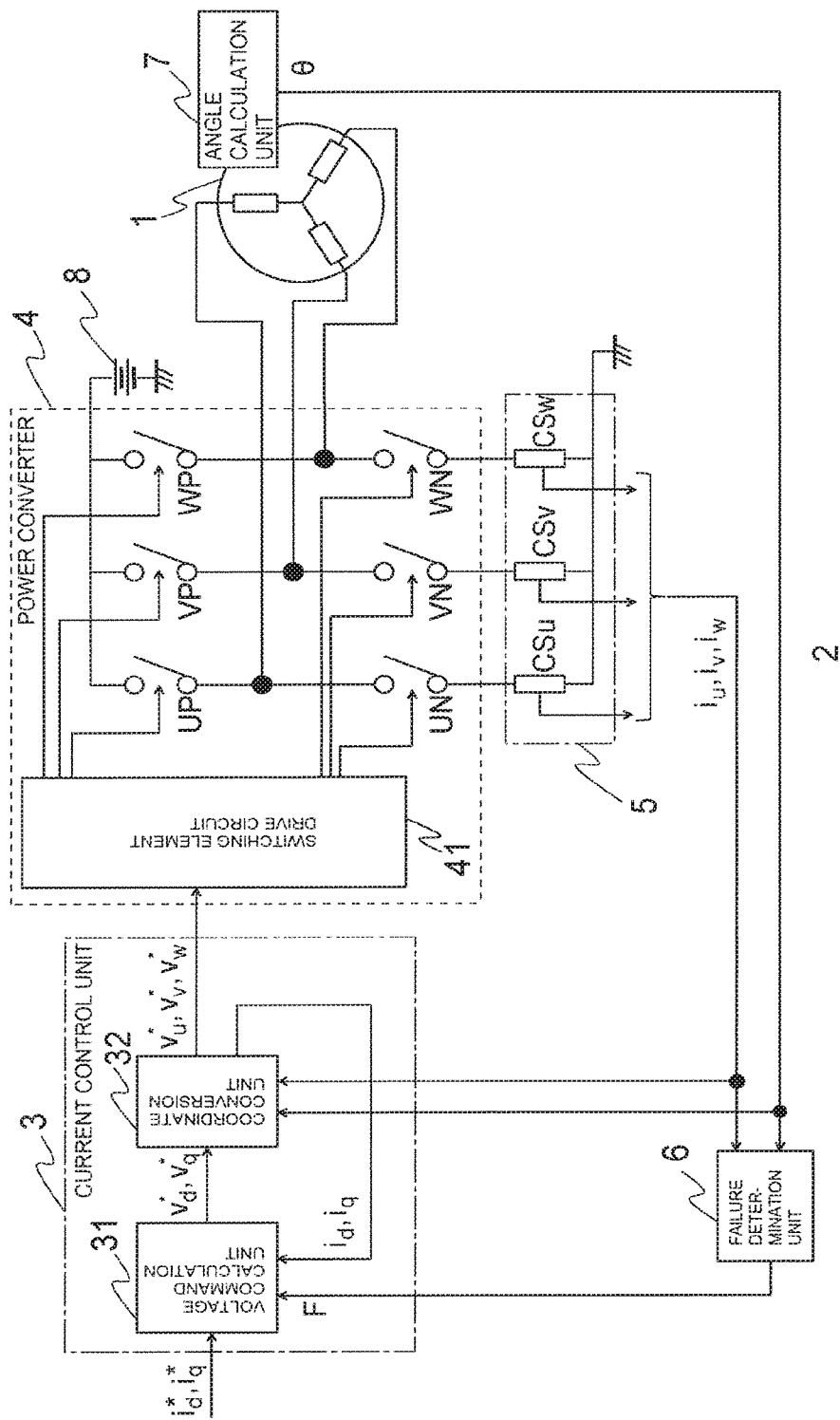
FIG. 5 is a block diagram for illustrating a configuration of a control device for a motor according to a second embodiment of the present invention.

FIG. 5 is a block diagram for illustrating a configuration of a control device for a motor according to a second embodiment of the present invention. A difference between the second embodiment and the first embodiment is only a configuration of the failure determination unit 6. The other configurations and operations are the same as those of the first embodiment, and a description thereof is omitted herein.

Specifically, in the second embodiment, the failure determination unit 6 is different from the first embodiment in that the failure determination unit 6 is configured to convert the current errors in the respective phases to values on the d axis and the q axis, which are the rotating Cartesian coordinate axes. In the first embodiment, only the current errors in the respective phases from the current sensor 5 are input to the failure determination unit 6. However, in the second embodiment, as illustrated in FIG. 5, in addition to the current errors in the respective phases from the current sensor 5, the angle signal θ from the angle calculation unit 7 is input to the failure determination unit 6.

The failure determination unit 6 obtains a d-axis current error Δid and a q-axis current error Δiq by applying coordinate conversion based on the angle signal θ to the current errors Δiu, Δiv, and Δiw in the respective phases through use of Expression (5), for example, and calculates the current error determination value ΔIj based on the d-axis current error Δid and the q-axis current error Δiq. Thus, a flow of processing to be executed by the failure determination unit 6 is basically the same as that of FIG. 4, but the calculation method described in Step S3 and the value of the failure determination threshold value Ith in Step S4 are different from those in the first embodiment.

Also in the second embodiment, the angle calculation unit 7 is formed of an angle sensor, for example, a resolver. The angle calculation unit 7 outputs the value of the rotation angle of the motor 1 detected by the angle sensor as the angle signal θ. However, the configuration is not limited to this example, and the angle calculation unit 7 may calculate an estimation value of the rotation angle, and the failure determination unit 6 may use the estimation value of the rotation angle.

Current error vectors:

$\vec{\Delta i}_d, \vec{\Delta i}_q$ on the d axis and the q axis are obtained by applying the coordinate conversion of converting the current error vectors in the respective phases:

$\vec{\Delta i}_u, \vec{\Delta i}_v, \vec{\Delta i}_w$ based on the angle signal θ to the current error vectors on the d axis and the q axis. The current error vectors on the d axis and the q axis:

$\vec{\Delta i}_d, \vec{\Delta i}_q$ can be given by Expression (31) through use of unit vectors corresponding to the d axis and the q axis:

$\vec{d}, \vec{q}$ $$\begin{cases} \vec{\Delta i}_d = \Delta i_d \cdot \vec{d} \\ \vec{\Delta i}_q = \Delta i_q \cdot \vec{q} \end{cases} \quad (31)$$

Figure 6:
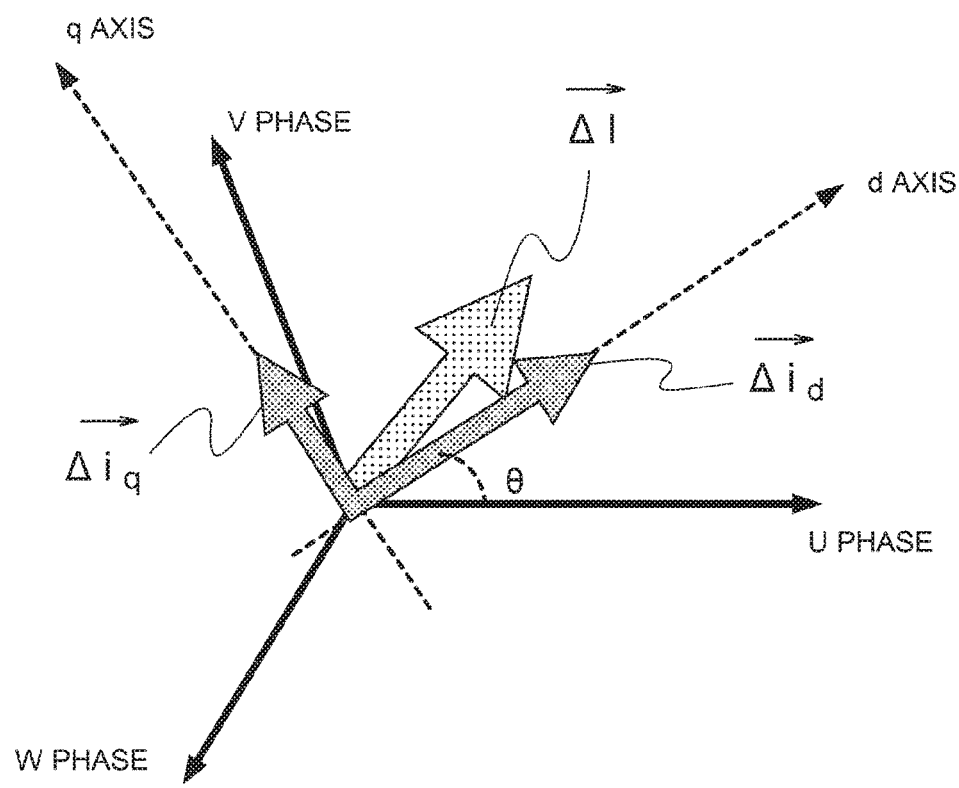
FIG. 6 is a diagram for illustrating an example of current error vectors on a d axis and a q axis, which are rotating Cartesian coordinate axes, and the current error resultant vector in the second embodiment of the present invention.

FIG. 6 is a diagram for illustrating an example of the current error vectors on the d axis and the q axis, which are the rotating Cartesian coordinate axes, and a current error resultant vector in the second embodiment. The magnitude:

$|\vec{\Delta I}|$ of the current error resultant vector:

$\vec{\Delta I}$, which is the sum of the vectors in the respective phases having the current errors in the respective phases as the magnitudes thereof can be obtained also based on the d-axis current error Δid and the q-axis current error Δiq obtained through use of the coordinate conversion. Therefore, the current error determination value ΔIj is calculated as given by Expression (32) based on the d-axis current error Δid and the q-axis current error Δiq obtained through use of the coordinate conversion. In this case, it is only required to set the failure determination threshold value Ith to (Ith=(√(⅔))× ε, and determine that a failure exists when the current error determination value ΔIj is equal to or larger than the failure determination threshold value Ith. Also in Expression (32), ΔIamp represents a value indicating the magnitude of the torque ripple, and hence appropriate failure determination can be made also with this method similarly to the first embodiment.

$$\Delta I_j = \sqrt{\Delta i_d^2 + \Delta i_q^2} = \sqrt{\frac{2}{3}} \Delta I_{amp} \quad (32)$$

The values of Δid and Δiq change depending on the angle signal θ as given by Expression (5). The current error determination value ΔIj given by Expression (32) can be considered as being independent of the angle signal θ through use of the relationship of (sin θ)²+(cos θ)²=1. That is, such an effect is obtained that a failure can be determined independently of the angle signal θ through the determination using the current error determination value ΔIj given by Expression (32) based on the d-axis current error Δid and the q-axis current error Δiq.

Moreover, in order to simplify the calculation, a current error determination value ΔIj obtained without the calculation of the square root may be used as given by Expression (33). In such a case, it is only required to determine that a failure exists when the current error determination value ΔIj is equal to or larger than a square (=Ith²) of the error determination threshold value Ith.

$$\Delta I_j = \Delta i_d^2 + \Delta i_q^2 \quad (33)$$

Moreover, the d-axis current error Δid and the q-axis current error Δiq may be set to current error determination values ΔIjd and ΔIjq, respectively, to thereby be able to determine whether or not a failure exists. In such a case, for example, the number of times for which any one of the current error determination values ΔIjd and ΔIjq has become larger than the failure determination threshold value Ith is counted for a certain period "t" set in advance, and the counted number is set as the failure determination counter cnt. Then, it is determined whether or not the failure determination counter cnt is equal to or larger than the failure fixing threshold value Cth. When the failure determination counter cnt is equal to or larger than the failure fixing threshold value Cth, the current sensor 5 is determined to have a failure. At this time, the current error determination values ΔIjd and ΔIjq change depending on the angle signal θ, and hence it can be determined whether or not a failure exists through such setting that the counter cnt is not reset for the certain period "t".

Moreover, failure determination counters cntd and cntq corresponding to the current error determination values ΔIjd and ΔIjq, respectively, may be used in place of the failure determination counter cnt. The number of times for which the current error determination value ΔIjd has become larger than the failure determination threshold value Ith is counted for the certain period "t" set in advance, and it is determined whether or not the failure determination counter cntd is equal to or larger than the failure fixing threshold value Cth. Similarly, the number of times for which the current error determination value ΔIjq has become larger than the failure determination threshold value Ith is counted for the certain period "t" set in advance, and it is determined whether or not the failure determination counter cntq is equal to or larger than the failure fixing threshold value Cth. Then, when the failure determination counter cntd or the failure determination counter cntq is equal to or larger than the failure fixing threshold value Cth, the current sensor 5 is determined to have a failure. Also in this case, it can be determined whether or not the current sensor 5 has a failure through such setting that the failure determination counters cntd and cntq are not reset for the certain period "t".

Whether or not a failure exists is determined in accordance with the magnitudes of the converted values on the d axis and the q axis, which are the rotating Cartesian coordinate axes, to thereby able to evaluate the magnitude of the torque ripple to determine whether or not a failure exists. As a result, for values of the current errors that do not cause a torque ripple, the control of the motor can be continued without stopping the control or changing the control method therefor. Meanwhile, for the current errors that cause an excessive torque ripple, the current sensor 5 can be determined to have a failure, to thereby be able to stop the control of the motor 1 or change the control method therefor. In such a manner, in the second embodiment, the determination of the failure of the current sensor 5 can appropriately be made, and the motor 1 can thus stably be controlled without occurrence of an excessive torque ripple.

Third Embodiment

Figure 7:
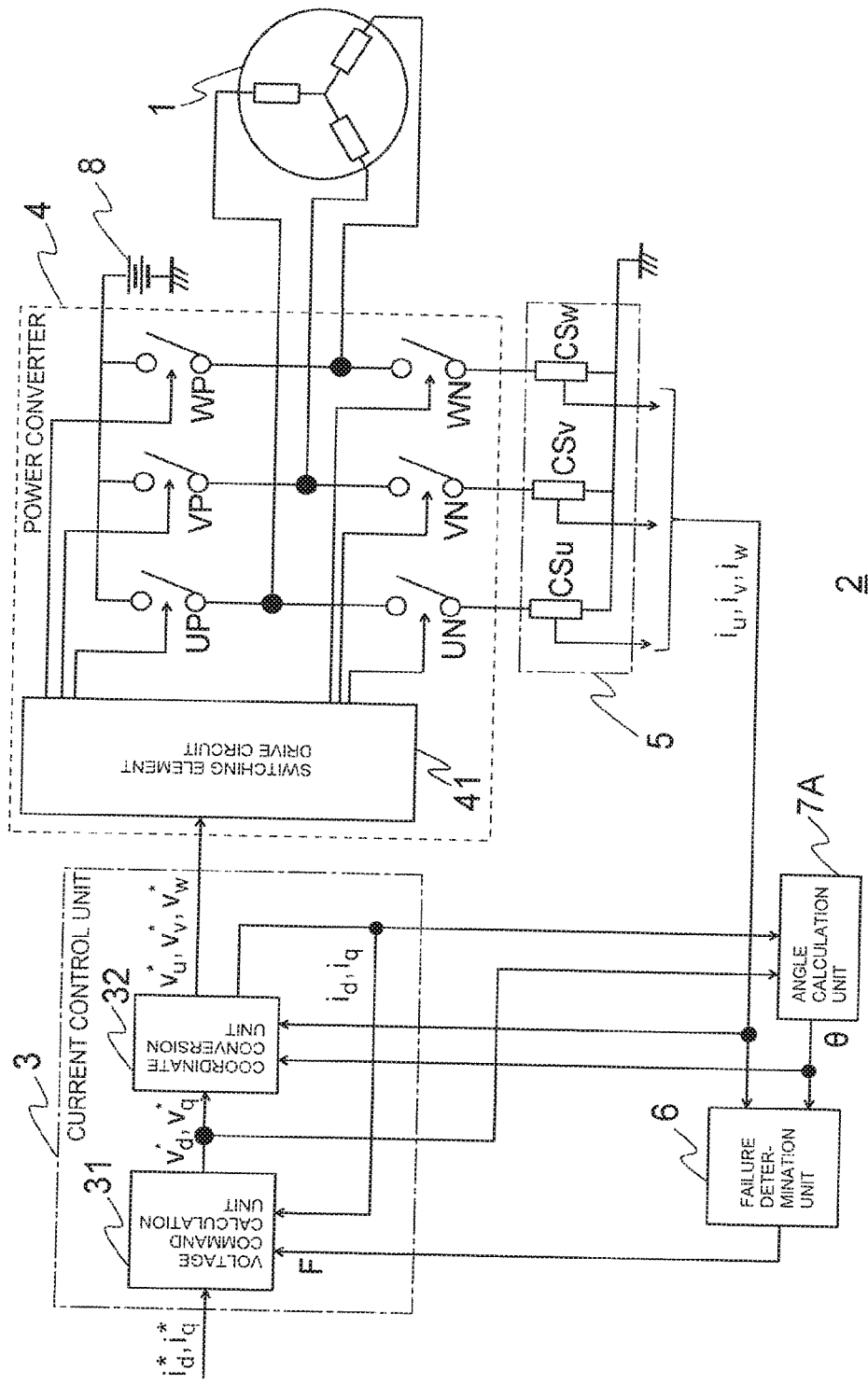
FIG. 7 is a block diagram for illustrating a configuration of a control device for a motor according to a third embodiment of the present invention.

FIG. 7 is a block diagram for illustrating a configuration of a control device for a motor according to a third embodiment of the present invention. A difference between the third embodiment and the second embodiment is only that an angle calculation unit 7A is provided in place of the angle calculation unit 7 in the third embodiment. The other configurations and operations are the same as those of the second embodiment, and a description thereof is thus omitted herein.

In the third embodiment, the angle calculation unit 7A is configured to calculate the angle signal θ based on the detected currents in the respective phases detected by the current sensor 5. That is, the angle calculation unit 7 is configured not to detect the rotation angle of the motor 1, but to calculate an estimation value of the rotation angle θ of the motor 1 to output the estimation value as the angle signal θ. A calculation method for the angle signal θ is only required to be a method based on the detected currents in the respective phases detected by the current sensor 5, and is not particularly limited. As an example, a description is given of a configuration that uses an induced voltage for the estimation as described in Patent Literature 3.

First, as described above, the current sensor 5 acquires the currents in the respective phases of the motor 1 when the lower switching elements UN, VN, and WN in the respective phases are each turned on, and outputs the detected currents iu, iv, and iw. The detected currents iu, iv, and iw are input to the coordinate conversion unit 32.

The calculation method described in Patent Literature 3 uses a fact that an induced voltage of the motor 1 is proportional to the rotation speed of the electric motor 1, namely, a derivative of the rotation angle. First, the coordinate conversion unit 32 calculates the d-axis detected current id and the q-axis detected current iq from the d-axis voltage command vd*, the q-axis voltage command vq*, and the detected currents iu, iv, and iw in the respective phases based on the angle signal θ. The angle calculation unit 7A inputs the d-axis detected current id and the q-axis detected current iq, and forms an observer given by Expressions (34) to (38), to thereby calculate an estimated speed ω. In Expressions (34) to (38), kp, ki, g11, g12, g21, g22, g31, g32, g41, and g42 represent feedback gains for calculating the estimated speed ω. The angle signal θ is calculated by integrating the estimated speed ω through use of Expression (39).

$$\omega = wr0 - \frac{e04}{pdr0} \quad (34)$$

$$wr0 = \left(kp + \frac{ki}{s}\right)(eq \cdot pdr0) \quad (35)$$

$$\frac{d}{dt}\begin{pmatrix} id0 \\ iq0 \\ pdr0 \end{pmatrix} = \quad (36)$$

$$\begin{pmatrix} -\frac{R}{Ld} & \frac{Lq}{Ld}\omega & 0 \\ -\frac{Ld}{Lq}\omega & -\frac{R}{Lq} & -\frac{wr0}{Lq} \\ 0 & 0 & 0 \end{pmatrix}\begin{pmatrix} id0 \\ iq0 \\ pdr0 \end{pmatrix} + \begin{pmatrix} \frac{1}{Ld} & 0 \\ 0 & \frac{1}{Lq} \\ 0 & 0 \end{pmatrix}\begin{pmatrix} vd^* \\ vq^* \end{pmatrix} - \begin{pmatrix} e01 \\ e02 \\ e03 \end{pmatrix}$$

$$\begin{pmatrix} e01 \\ e02 \\ e03 \\ e04 \end{pmatrix} = \begin{pmatrix} g11 & g12 \\ g21 & g22 \\ g31 & g32 \\ g41 & g42 \end{pmatrix}\begin{pmatrix} ed \\ eq \end{pmatrix} \quad (37)$$

$$\begin{pmatrix} ed \\ eq \end{pmatrix} = \begin{pmatrix} id0 - id \\ iq0 - iq \end{pmatrix} \quad (38)$$

$$\theta = \int \omega dt \quad (39)$$

The angle signal θ is calculated based on the d-axis detected current id and the q-axis detected current ig calculated from the detected currents iu, iv, and iw in the respective phases, and the angle signal θ thus contains an estimation error due to the current errors contained in the detected currents in the respective phases. In particular, when a magnitude of the estimation error Δθ of the angle signal exceeds 90 deg, a torque is generated toward an opposite direction.

Therefore, it is required to estimate, in advance, a permissible range of the current error so that the estimation error Δθ of the angle signal is equal to or less than 90 deg, and determine that a failure exists when the estimation error exceeds the permissible range of the current error, to thereby stop the control of the motor or change the control method therefor.

Moreover, even when the estimation error Δθ of the angle signal is equal to or less than 90 deg, a torque ripple occurs due to a change in the estimation error Δθ of the angle signal caused by changes in the current errors Δid and Δiq on the d axis and q axis. The current errors Δid and Δiq on the d axis and q axis change depending on the angle signal θ as given by Expression (5). Meanwhile, the angle signal θ is calculated from the d-axis detected current id and the q-axis detected current iq, and the estimation error Δθ of the angle signal θ thus changes depending on the current errors Δid and Δiq on the d axis and q axis.

The voltage command calculation unit 31 executes the current control so that the current commands id* and iq* and the detected currents id and iq on the d axis and q axis match each other, respectively. However, currents ide and iqe on the rotating Cartesian coordinate axes dependent on the actual rotation angle θ are given by Expression (40). The torque generated by the motor 1 is determined by the currents ide and iqe on the rotating Cartesian coordinate axes dependent on the actual rotation angle ε, and a torque ripple thus occurs when the estimation error Δθ in the angle signal θ changes. Therefore, when an excessive torque ripple occurs, it is required to determine that the motor 1 has a failure, to thereby stop the control of the motor 1 or change the control method therefor.

$$\begin{bmatrix} i_{de} \\ i_{qe} \end{bmatrix} = \begin{bmatrix} \cos\Delta\theta & \sin\Delta\theta \\ -\sin\Delta\theta & \cos\Delta\theta \end{bmatrix} \begin{bmatrix} i_d \\ i_q \end{bmatrix} \quad (40)$$

The failure determination unit 6 converts the current errors Δiu, Δiv, and Δiw in the respective phases to the current errors Δid and Δiq on the d axis and the q axis, which are the rotating Cartesian coordinate axes, based on the angle signal θ, and determines whether or not a failure exists based on the current error determination value ΔIj calculated through use of Expression (32).

The values of Δid and Δiq change depending on the angle signal θ similarly to Expression (5). The current error determination value ΔIj given by Expression (32) can be considered as being independent of the angle signal θ through use of the relationship of $(\sin\theta)^2 + (\cos\theta)^2 = 1$. That is, such an effect is obtained that a failure can be determined independently of the angle signal θ through the determination using the current error determination value ΔIj given by Expression (32) based on the d-axis current error Δid and the q-axis current error Δiq.

Moreover, the d-axis current error Δid and the q-axis current error Δiq may be set to current error determination values ΔIjd and ΔIjq, respectively, to thereby be able to determine whether or not a failure exists. In such a case, for example, the number of times for which any one of the current error determination values ΔIjd and ΔIjq has become larger than the failure determination threshold value Ith is counted for a certain period "t" set in advance. Then, it is determined whether or not the failure determination counter cnt is equal to or larger than the failure fixing threshold value Cth. When the failure determination counter cnt is equal to or larger than the failure fixing threshold value Cth, the current sensor 5 is determined to have a failure. At this time, the current error determination values ΔIjd and ΔIjq change depending on the angle signal θ, and hence it can be determined whether or not a failure exists in the current sensor 5 through such setting that the counter cnt is not reset for the certain period "t".

Moreover, failure determination counters cntd and cntq corresponding to the current error determination values ΔIjd and ΔIjq, respectively, may be used in place of the failure determination counter cnt. The number of times for which the current error determination value ΔIjd has become larger than the failure determination threshold value ith is counted for the certain period "t" set in advance, and it is determined whether or not the failure determination counter cntd is equal to or larger than the failure fixing threshold value Cth. Similarly, the number of times for which the current error determination value ΔIjq is larger than the failure determination threshold value ith is counted for the certain period "t" set in advance, and it is determined whether or not the failure determination counter cntq is equal to or larger than the failure fixing threshold value Cth. Then, when the failure determination counter cntd or the failure determination counter cntq is equal to or larger than the failure fixing threshold value Cth, the current sensor 5 is determined to have a failure. Also in this case, it can be determined whether or not the current sensor 5 has a failure through such setting that the failure determination counters cntd and cntq are not reset for the certain period "t".

In the description given above, the current error determination value ΔIj is determined based on the current errors Δid and Δiq on the d axis and q axis through use of Expression (32). This is because the angle signal θ is calculated based on the d-axis detected current id and the q-axis detected current iq, and the current errors can thus be determined in consideration of the influence on the angle signal θ. However, similar determination can be made without using the current errors Δid and Δiq on the d axis and q axis. Irrespective of which of the magnitude of the vector calculated through use of Expression (20) and the magnitude of the vector calculated through use of Expression (25) is used, only the coordinate systems to be used for the calculation are different from each other between those cases, and the same value can be consequently obtained. Thus, the failure of the current sensor 5 can similarly be determined.

With the above-mentioned configuration, the control of the motor can be continued without stopping the control or changing the control method therefor for the values of the current errors that do not cause a torque ripple by evaluating the magnitude of the torque ripple to determine whether or not a failure exists. Meanwhile, for current errors that cause an excessive torque ripple, the current sensor is determined to have a failure, to thereby be able to stop the control of the motor 1 or change the control method therefor. As described above, the third embodiment is also effective for the torque ripple caused by the estimation error in the angle signal, and can thus appropriately determine a failure in the current sensor 5 for the current errors that cause an excessive torque ripple. Therefore, the motor 1 can stably be controlled without the occurrence of an excessive torque ripple.

In the third embodiment, the rotation angle of the motor 1 is estimated based on the d-axis detected current and the q-axis detected current, but the rotation angle may be estimated based on an α-axis current and a β-axis current. In such a case, it is only required that whether or not a failure exists be determined based on the current error determination value ΔIj obtained through use of Expression (25).

Irrespective of which of the magnitude of the vector calculated based on the current errors in the respective phases through use of Expression (20) and the magnitude of the vector calculated based on the d-axis current error and the q-axis current error through use of Expression (32) is used, only the coordinate systems to be used for the calculation are different from each other between those cases, and the similar values, namely, the values indicating the magnitude of the torque ripple, can consequently be obtained.

Fourth Embodiment

Figure 8:
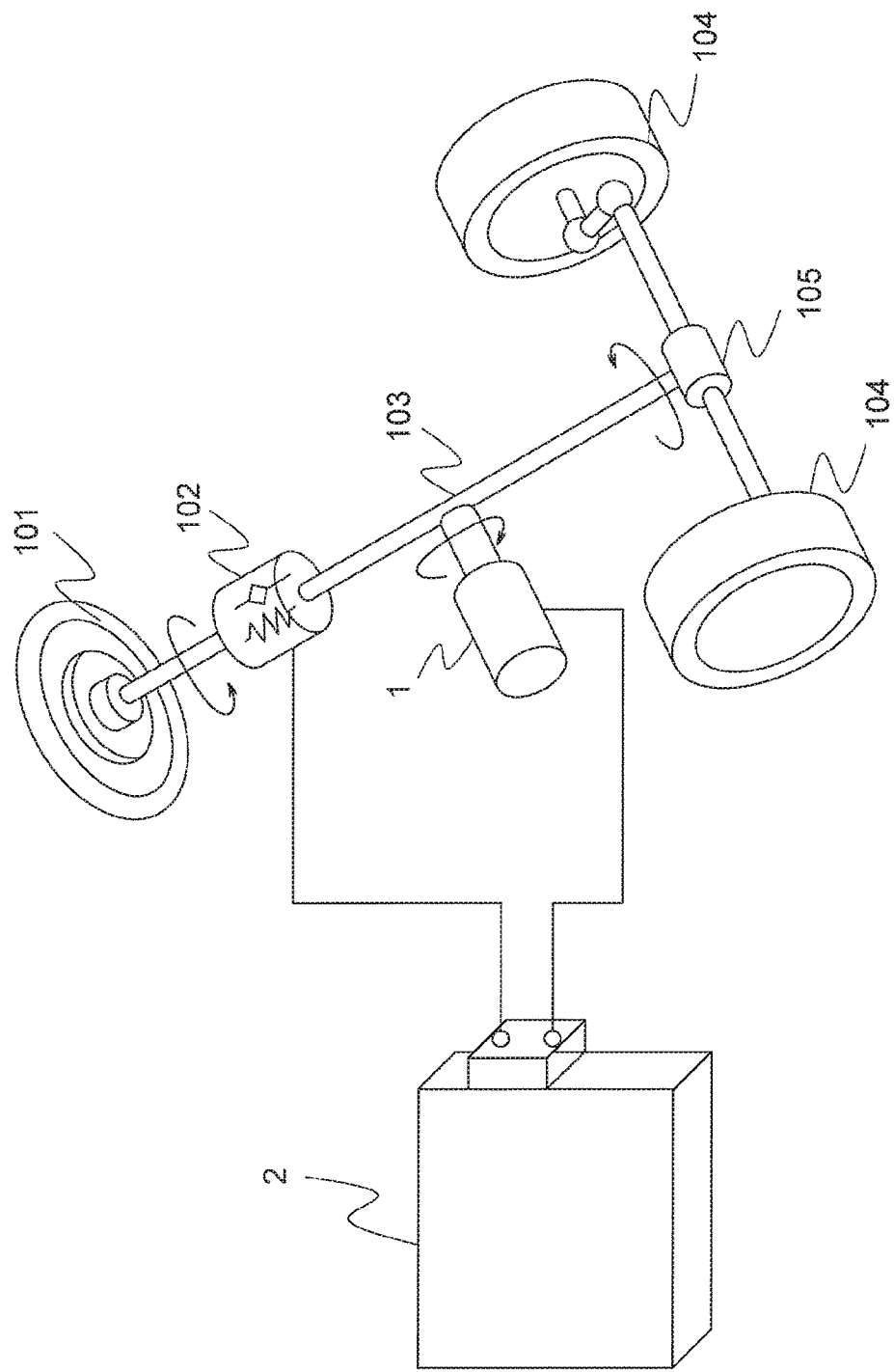
FIG. 8 is a diagram for illustrating a configuration of an electric power steering system according to a fourth embodiment of the present invention.

A fourth embodiment of the present invention relates to an electric power steering system including the control device for a motor described in any one of the first embodiment to the third embodiment. The configuration of the electric power steering system is illustrated in FIG. 8. In FIG. 8, in the electric power steering system, a steering wheel 101, a steering shaft 103, a rack-and-pinion gear 105, wheels 104, a motor 1, a control device 2, and a torque sensor 102 are provided. The motor 1 is configured to assist steering by the driver. The control device 2 is configured to control the motor 1. The torque sensor 102 is configured to detect a steering torque of the driver. In FIG. 8, the motor 1 and the control device 2 correspond to the motor 1 and the control device 2, respectively, in the first embodiment to the third embodiment. In this embodiment, the control device 2 is formed of, for example, an electronic control unit (ECU).

In FIG. 8, the steering torque applied from a driver (not shown) to the steering wheel 101 is transmitted to a rack through a torsion bar of the torque sensor 102, the steering shaft 103, and the rack-and-pinion gear 105, to thereby steer the wheels 104.

The motor 1 generates an assist force as output through use of the electric power supplied from the power converter 4 provided in the control device 2. The assist force is transmitted to the steering shaft 103, to thereby reduce the steering torque applied by the driver during the steering.

With the above-mentioned configuration, also in the fourth embodiment, as in the first embodiment to the third embodiment, the current sensor 5 is not determined to have a failure for current errors that do not cause an excessive torque ripple, and the control of the motor 1 can thus be continued. Therefore, the assist by the motor 1 can be continuously provided, and the steering by the driver is eased. Moreover, the current sensor 5 can be determined to have a failure for current errors that cause an excessive torque ripple, and a sense of discomfort caused by the excessive torque ripple can be eliminated by stopping the control of the motor 1 or switching the control method to another control method.

As described above, the electric power steering system according to the fourth embodiment includes the motor 1 configured to generate the assist force for assisting the steering by the driver, and the control device 2 configured to control the motor 1 according to any one of the first embodiment to the third embodiment. Therefore, as in the first embodiment to the third embodiment, it can be determined whether or not a failure exists by evaluating the magnitude of the torque ripple, and such a determination that a failure exists can thus appropriately be made for current errors that cause an excessive torque ripple. Further, it is not determined that a failure exists for current errors that do not cause an excessive torque ripple, and the control of the motor can thus be continued. Therefore, the assist by the motor can be continuously provided, and the steering by the driver is eased. Moreover, it can be determined that a failure exists for current errors that cause an excessive torque ripple, and a sense of discomfort caused by the excessive torque ripple can be eliminated by stopping the control of the motor or switching the control method to another control method.

Moreover, the first embodiment to the fourth embodiment may be changed as described below.

The current sensor 5 in the first embodiment to the fourth embodiment described above is configured to detect the U-phase detected current iu, the V-phase detected current iv, and the W-phase detected current iw as the currents flowing in the respective phases of the motor 1. Herein, the currents in the three phases are detected, but the currents in a part of the phases may not be detected, and may be estimated only from the currents in the detected phases. For example, the current in the W phase is calculated from the U-phase detected current iu and the V-phase detected current iv based on the Kirchhoff circuit law through use of Expression (41).

$$iw = -iu - iv \quad (41)$$

In this case, the current error Δiw in the W phase is given by Expression (42). It is only required that the current error determination value ΔIj be calculated based on the U-phase current error Δiu and the V-phase current error Δiw acquired from the current sensor 5, and on the current error Δiw obtained through use of Expression (42), to determine whether or not the current sensor 5 has a failure. Also in this case, for current errors that cause an excessive torque ripple, whether or not the current sensor 5 has a failure can appropriately be determined based on the current errors in the respective phases.

$$\Delta iw = -\Delta iu - \Delta iv \quad (42)$$

In the first embodiment to the fourth embodiment, for the sake of simple description, the motor 1 having the windings in the three phases is described, but as long as the phases is equal to or larger than three, the sum of the vectors having the magnitude of the current errors in the respective phases can be obtained. Therefore, whether or not a failure exists can appropriately be determined for current errors that cause an excessive torque ripple by applying the first embodiment to the third embodiment of the present invention also to a motor in "m" phases, which are four phases or twelve phases, for example, as the electric motor 1. In this case, "m" is any integer of three or more. Moreover, when current errors in the respective phases detected from at least "m−1" phase current sensors out of the "m" phases are available, a current error in the remaining one phase is calculated, to thereby be able to obtain the current error determination value. Thus, in the processing in Step S1 of FIG. 4, it is only required to determine whether or not at least "m−1" lower switching elements in the respective phases are turned off.

The failure determination described in the first embodiment to the fourth embodiment of the present invention can be applied not only to the determination for the failure of the current sensor 5 but also to the determination for a failure of the power converter 4. For example, the respective switching elements are controlled to be turned on and off by the switching element drive circuit 41 included in the power converter 4. With this configuration, when the respective switching elements are not normally controlled to be turned on and off in accordance with an instruction of the switching element drive circuit 41, the current errors in the respective phases acquired when the lower switching elements are turned off are not zero, and hence whether or not the power converter 4 has a failure can be determined based on the current errors in the respective phases.

REFERENCE SIGNS LIST 1 motor, 2 control device, 3 current control unit, 4 power converter, 5 current sensor, 6 failure determination unit, 7, 7A angle calculation unit, 8 DC power supply, 31 voltage command calculation unit, 32 coordinate conversion unit, 41 switching element drive circuit, 101 steering wheel, 102 torque sensor, 103 steering shaft, 104 wheel, 105 rack-and-pinion gear

The invention claimed is:

1. A control device for a motor configured to control a motor, the motor including windings in "m" phases, where "m" is an integer of three or more, the control device comprising:

a current control unit configured to input a current command value from an outside of the control device, and output a drive command so that a current detection value matches the current command value;

a power converter, which includes an upper switching element and a lower switching element provided in correspondence to each of the phases of the motor, and is configured to control the upper switching elements and the lower switching elements to turn on and off in accordance with the drive command from the current control unit, to thereby supply electric power to the motor;

a current sensor, which is connected in series to the lower switching element in each of the phases, and is configured to detect a current value in each of the phases to output the current value to the current control unit as the current detection value; and a failure determination unit configured to determine whether the current sensor has a failure, wherein, when each of the lower switching elements in at least "m−1" phases out of the "m" phases is turned off, the current sensor detects current errors in the at least "m−1" phases, wherein the failure determination unit is configured to calculate a current error determination value based on the current errors, and determine whether the current sensor has a failure based on the current error determination value, and wherein the current error determination value is calculated based on any one of: a magnitude of a sum of current error vectors in the respective phases each having a value of the current error in each of the phases as a magnitude; values obtained by converting the detected current errors in the respective phases to currents in an α-axis and a β-axis which are fixed Cartesian coordinates; and values obtained by converting the detected current errors in the respective phases to currents in a d-axis and a q-axis which are rotating Cartesian coordinates.

2. The control device for a motor according to claim 1, wherein, when each of the lower switching elements in each of the phases is turned on, the current sensor detects a current in each of the phases of the motor to output the current detection value, and wherein the control device further comprises an angle calculation unit configured to calculate an estimation value of a rotation angle of the motor based on the current detection value output from the current sensor to output the estimation value as an angle signal.

3. The control device for a motor according to claim 1, wherein the current error determination value is calculated based on the magnitude of the sum, and wherein the magnitude of the sum is calculated based on a sum of squares of the current errors in the respective phases.

4. The control device for a motor according to claim 1, wherein the current error determination value is calculated based on the magnitude of the sum, and wherein the magnitude of the sum is calculated based on a sum of squares of values each obtained by subtracting an average value of the current errors in the respective phases from the current error in each of the phases.

5. The control device for a motor according to claim 1, wherein the current error determination value is calculated based on the magnitude of the sum, and wherein the magnitude of the sum is calculated as a sum of squares of values each being a difference between the current errors in respective two phases out of the phases.

6. The control device for a motor according to claim 1, wherein the current error determination value is calculated based on a sum of squares of values of Cartesian coordinates obtained by converting the current errors in the respective phases.

7. The control device for a motor according to claim 1, wherein "m" is three, and the motor includes windings in three phases, and wherein the current error determination value includes any one of:

$$\Delta I_j = \sqrt{\Delta i_u^2 + \Delta i_v^2 + \Delta i_w^2 - \Delta i_u \Delta i_v - \Delta i_v \Delta i_w - \Delta i_w \Delta i_u},$$

which is a magnitude of a sum of current error vectors in the respective phases each having a value $\Delta iu$, $\Delta iv$, or $\Delta iw$ of a current error in each of the phases as a magnitude;

$$\Delta I_j = \sqrt{\Delta i_\alpha^2 + \Delta i_\beta^2},$$

which is a value calculated from values $\Delta i\alpha$ and $\Delta i\beta$ on an α axis and a β axis, which are said fixed Cartesian coordinates, the values $\Delta i\alpha$ and $\Delta i\beta$ being obtained by converting the current errors $\Delta iu$, $\Delta iv$, and $\Delta iw$ in the respective phases; and $$\Delta I_j = \sqrt{\Delta i_d^2 + \Delta i_q^2},$$

which is a value calculated from values $\Delta id$ and $\Delta iq$ on a d axis and a q axis, which are said rotating Cartesian coordinates, the values $\Delta id$ and $\Delta iq$ being obtained by converting the current errors $\Delta iu$, $\Delta iv$, and $\Delta iw$ in the respective phases.

8. An electric power steering system, comprising:

a motor configured to generate an assist force for assisting steering by a driver; and the control device for a motor of claim 1, which is configured to control the motor.

* * * * *